United States Patent [19]

Nayebi et al.

[11] Patent Number: 5,828,254

[45] Date of Patent: *Oct. 27, 1998

[54] ERROR REGULATOR CIRCUIT FOR SAMPLE AND HOLD PHASE LOCKED LOOPS

[75] Inventors: Mehrdad Nayebi, Palo Alto; Duc Ngo, San Jose, both of Calif.

[73] Assignees: Sony Corporation, Tokyo, Japan; Sony Electronics, Inc., Park Ridge, N.J.

[*] Notice: This patent issued on a continued prosecution application filed under 37 CFR 1.53(d), and is subject to the twenty year patent term provisions of 35 U.S.C. 154(a)(2).

[21] Appl. No.: 584,925

[22] Filed: Jan. 11, 1996

Related U.S. Application Data

[60] Provisional application No. 60/000,373 Jan. 21, 1995.

[51] Int. Cl.[6] .................................................. H03L 7/06
[52] U.S. Cl. ........................ 327/157; 327/536; 327/538; 331/17
[58] Field of Search .................. 327/3, 23, 26, 327/31, 34, 35, 36, 148, 157, 172, 173, 174, 175, 232, 236, 244, 536, 538; 331/17, 25

[56] References Cited

U.S. PATENT DOCUMENTS

| | | | |
|---|---|---|---|
| 4,216,388 | 8/1980 | Wilson | 327/34 |
| 4,414,433 | 11/1983 | Horie et al. | 179/70 |
| 4,547,741 | 10/1985 | Katakura | 330/149 |
| 5,095,287 | 3/1992 | Irwin et al. | 331/1 A |
| 5,148,168 | 9/1992 | Masuda et al. | 341/152 |
| 5,223,945 | 6/1993 | Honda et al. | 358/335 |
| 5,260,979 | 11/1993 | Parker et al. | 331/17 |
| 5,272,453 | 12/1993 | Traynor et al. | 331/17 P |
| 5,304,955 | 4/1994 | Atriss et al. | 327/159 |
| 5,362,990 | 11/1994 | Alvarez et al. | 327/536 |
| 5,363,326 | 11/1994 | Nakajima | 365/149 |

*Primary Examiner*—Timothy P. Callahan
*Assistant Examiner*—Jung Ho Kim
*Attorney, Agent, or Firm*—Haverstock & Owens LLP

[57] ABSTRACT

An error regulator circuit for use within a charge pump circuit of a phase-locked loop monitors levels of the control signals used to control the charge pump circuit. When one of the control signals remains at a predetermined voltage level for a predetermined period of time, indicating that the charge pump circuit is in a hold mode or an inactive period of time, the current sources within the charge pump used to charge and discharge a charge pump capacitor are temporarily disabled. During a hold or inactive period when one of the control signals used to control the charge pump circuit remains at the predetermined voltage level for more than a predetermined period of time, the current sources of the charge pump circuit are disabled and the charge pump circuit is prevented from charging or discharging the charge pump capacitor until the current sources are re-enabled, thereby allowing the charge pump circuit to maintain an appropriate level of charge across the capacitor during an inactive or hold period. The current sources are re-enabled when the control signal which was at the predetermined voltage level for more than the predetermined period of time is no longer at the predetermined voltage level.

14 Claims, 4 Drawing Sheets

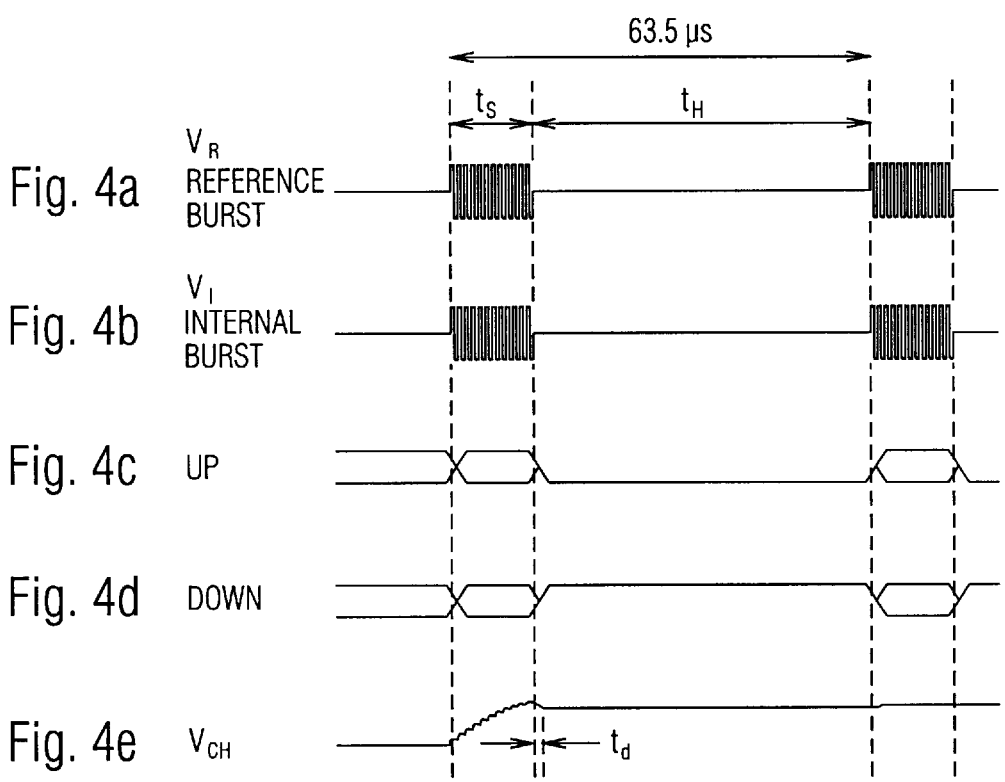

# ERROR REGULATOR CIRCUIT FOR SAMPLE AND HOLD PHASE LOCKED LOOPS

RELATED APPLICATIONS

This application claims priority under 35 U.S.C. § 119(e) of the co-pending U.S. provisional application Ser. No. 60/000,369 filed on Jun. 21, 1995 and entitled "Error Regulator Circuit For Sample And Hold Phase Locked Loops." The provisional application Ser. No. 60/000,373 filed on Jun. 21, 1995 and entitled "Error Regulator Circuit For Sample And Hold Phase Locked Loops" is also hereby incorporated by reference.

FIELD OF THE INVENTION

The present invention relates to the field of charge pump circuits used within a phase-locked loop. In particular, the present invention relates to the field of maintaining an appropriate level of charge on a charge pump capacitor during a non-active period.

BACKGROUND OF THE INVENTION

A charge pump circuit is generally included within a phase-locked loop. The charge pump circuit is provided with one or more control input signals. A level of charge is built up in response to the control input signals on a circuit storage element, typically a capacitor. The control input signals are typically provided from a phase detector circuit which generates a control signal that is representative of the difference in the phase of the two signals which are to be locked in phase together. The charge built up on the circuit storage element then corresponds to the level of the control signal generated by the phase detector circuit. Within phase-locked loops the charge that is built up on the circuit storage element is used to control the frequency of an output signal generated by a voltage controlled oscillator. By varying the charge stored on the circuit storage element using the charge pump circuit, the frequency and phase of the signal generated by the voltage controlled oscillator is controlled and locked to the phase and frequency of a reference signal.

The basic architecture of a conventional charge pump circuit of the prior art is illustrated in FIG. 1. The charge pump circuit includes two current sources IUp and IDown, two switches S1 and S2 and the charge pump capacitor CH. The first terminal of the current source IUp is coupled to a voltage source VCC. The second terminal of the current source IUp is coupled to the first terminal of the switch S1. The second terminal of the switch S1 is coupled to the first terminal of the switch S2 and the first terminal of the capacitor CH. The second terminal of the capacitor CH is coupled to ground. The second terminal of the switch S2 is coupled to the first terminal of the current source IDown. The second terminal of the current source IDown is coupled to ground. A control signal UP is coupled to control the operation of the switch S1. A control signal DOWN is coupled to control the operation of the switch S2.

The control signals UP and DOWN are provided from a phase detector circuit within a phase-locked loop in response to a difference in phase between a signal and a reference signal. Accordingly, if there is a positive phase difference between the signal and the reference signal, the control signal DOWN will be activated in order to correct the phase difference by discharging the capacitor CH through the current source IDown. If there is a negative phase difference between the signal and the reference signal, the control signal UP will be activated in order to correct the phase difference by charging the capacitor CH from the current source IUp.

In a system in which the phase-locked loop is only used periodically, there will be periods of time when the charge pump circuit is inactive. This is the case in a phase-locked loop used to lock two composite video signals together. In a video system, a phase-locked loop used to lock two composite video signals in phase will typically only operate during the burst period and will remain idle during non-burst periods. During these inactive periods of time, in a charge pump circuit, as illustrated in FIG. 1, the capacitor CH will not maintain its charge at an appropriate level when either of the control signals UP or DOWN are at an active high level during the inactive period. This potential variance of the built up level of charge across the capacitor CH from the appropriate level of charge during the inactive periods requires the charge pump circuit to restore the appropriate level of charge across the capacitor CH at the beginning of every active period. This can potentially prevent the phase-locked loop from locking the two video signals together in phase.

A timing diagram of selected signals from a phase-locked loop within a video system is illustrated in FIG. 2. A composite video burst reference signal VR is illustrated in FIG. 2a. An internal composite video burst signal VI is illustrated in FIG. 2b. Both of the composite video burst signals VR and VI have been separated from a composite video signal and include a burst period during which the signal is sampled and a non-burst or inactive period. The control signals UP and DOWN are illustrated in FIGS. 2c and 2d, respectively. The control signals UP and DOWN are active during the burst or sampling period and then maintained at a constant level during the non-burst or inactive period. The voltage level VCH across the capacitor CH is illustrated in FIG. 2e.

At the end of the burst or sampling period, in the example illustrated in FIG. 2, the control signal UP is pulled from a logical high voltage level down to a logical low voltage level and the control signal DOWN is raised from a logical low voltage level up to a logical high voltage level. These logical voltage levels are then maintained on the control signals UP and DOWN during the non-burst or inactive period. Within the charge pump circuit illustrated in FIG. 1, when the control signal DOWN is at a logical low voltage level the voltage VCH across the capacitor CH will be discharged. Thus, as illustrated in FIG. 2, in this charge pump configuration when the control signal DOWN is at a logical high voltage level at the end of the sampling period and is maintained at that level for a period of time, the voltage VCH across the capacitor CH will be discharged from the appropriate voltage level to a level below this appropriate level during the inactive or hold period. As illustrated in FIG. 2e, if the hold period is of sufficient duration, the capacitor CH may be completely discharged to ground level. Accordingly, at the beginning of the next sampling period, the voltage VCH across the capacitor CH must be restored to the appropriate level by the charge pump circuit. A phase lock between the two video signals VR and VI will therefore not be maintained during the hold period when the control signal DOWN is at a logical high voltage level. Correspondingly, if the control signal UP is at a logical high voltage level at the end of the sampling period, this logical high voltage level will be maintained during the hold period causing the capacitor CH to charge up to a voltage above the appropriate level of charge. At the beginning of the next sampling period, the voltage VCH across the capacitor CH must then be restored by discharging the capacitor CH to the appropriate level of charge.

What is needed is a charge pump circuit which will ensure that an appropriate level of charge is maintained across the charge pump capacitor during an inactive period.

SUMMARY OF THE INVENTION

An error regulator circuit for use within a charge pump circuit of a phase-locked loop monitors levels of the control signals used to control the charge pump circuit. When one of the control signals remains at a predetermined voltage level for a predetermined period of time, indicating that the charge pump circuit is in a hold mode or an inactive period of time, the current sources within the charge pump used to charge and discharge a charge pump capacitor are temporarily disabled. During a hold or inactive period when one of the control signals used to control the charge pump circuit remains at the predetermined voltage level for more than a predetermined period of time, the current sources of the charge pump circuit are disabled and the charge pump circuit is prevented from charging or discharging the charge pump capacitor until the current sources are re-enabled, thereby allowing the charge pump circuit to maintain an appropriate level of charge across the capacitor during an inactive or hold period. The current sources are re-enabled when the control signal which was at the predetermined voltage level for more than the predetermined period of time is no longer at the predetermined voltage level.

BRIEF DESCRIPTION OF THE DRAWINGS

FIGS. 4a–4e illustrate a timing diagram of selected signals within a charge pump circuit having an error regulator circuit according to the present invention.

DETAILED DESCRIPTION OF THE PREFERRED EMBODIMENT

A charge pump circuit having an error regulator circuit of the present invention maintains the voltage across the charge pump capacitor during an inactive period at an appropriate level by monitoring the control signals UP and DOWN and only allowing the voltage level across the capacitor CH to vary a predetermined amount before the current sources IUp and IDown are disabled. When either of the control signals UP or DOWN remain at a logical high voltage level for a predetermined period of time, indicating that the charge pump circuit is in a hold mode, the current sources IUp and IDown are temporarily disabled. Therefore, during a hold period, when one of the control signals UP or DOWN remains at a logical high voltage level for more than a predetermined period of time, the charge pump circuit is prevented from charging or discharging the capacitor CH past a predetermined threshold, thereby allowing the charge pump circuit to maintain an appropriate level of charge across the capacitor CH during an inactive or hold period.

Figure 3:
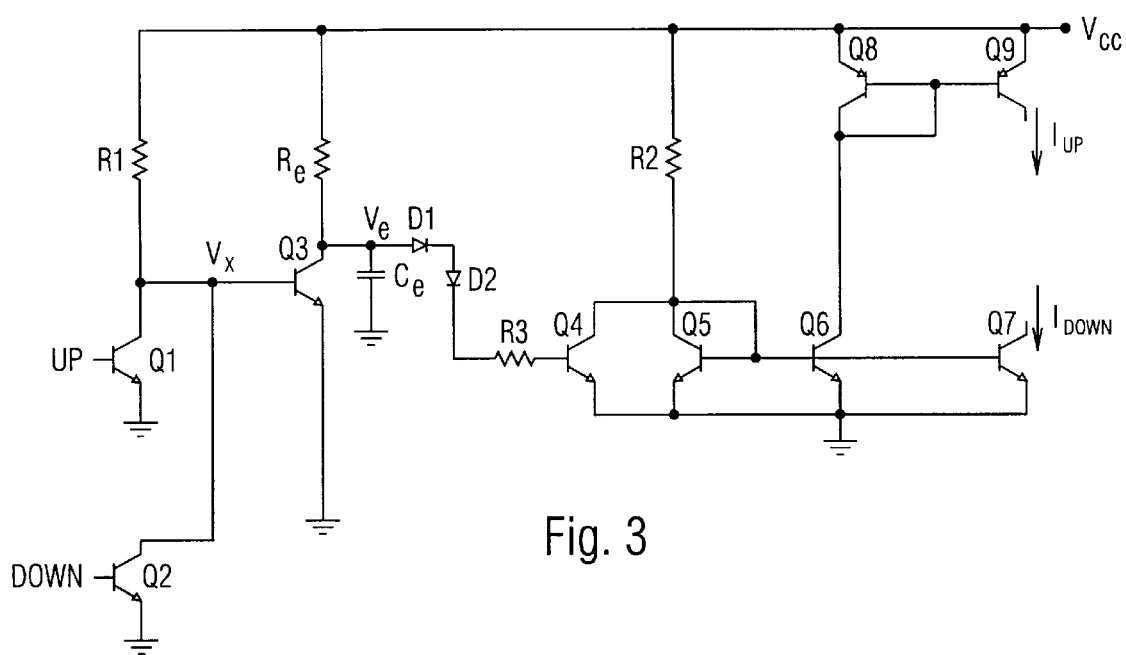
FIG. 3 illustrates an error regulator circuit of the present invention for use within a charge pump circuit.

The preferred embodiment of an error regulator circuit of the present invention is illustrated in FIG. 3. The error regulator circuit is coupled to disable the current sources IUp and IDown when it is detected that the charge pump is in a hold mode. The first terminal of a resistor R1 is coupled to a supply voltage VCC. The second terminal of the resistor R1 is coupled to the collector of an npn transistor Q1, to the collector of an npn transistor Q2 and to the base of an npn transistor Q3, thereby forming a node VX. The control signal UP is coupled to the base of the transistor Q1. The control signal DOWN is coupled to the base of the transistor Q2. The emitter of the transistor Q1 and the emitter of the transistor Q2 are both coupled to ground. The first terminal of a resistor Re is coupled to the supply voltage VCC. The second terminal of the resistor Re is coupled to the collector of the transistor Q3, to the first terminal of a capacitor Ce and to the anode of a diode D1, thereby forming a node Ve. The emitter of the transistor Q3 is coupled to ground. The second terminal of the capacitor Ce is coupled to ground. The cathode of the diode D1 is coupled to the anode of a diode D2. The cathode of the diode D2 is coupled to the first terminal of a resistor R3. The second terminal of the resistor R3 is coupled to the base of an npn transistor Q4.

The first terminal of a resistor R2 is coupled to the supply voltage VCC. The second terminal of the resistor R2 is coupled to the collector of the transistor Q4, to the collector and base of an npn transistor Q5, to the base of an npn transistor Q6 and to the base of an npn transistor Q7. The emitter of each of the transistors Q4, Q5, Q6 and Q7 are coupled to ground. The collector of the transistor Q7 is coupled to the charge pump circuit. The transistor Q7 is configured as the current source IDown for the charge pump circuit. The emitter of a pnp transistor Q8 is coupled to the supply voltage VCC. The emitter of a pnp transistor Q9 is coupled to the supply voltage VCC. The base of the transistor Q9 is coupled to the base and collector of the transistor Q8 and to the collector of the transistor Q6. The collector of the transistor Q9 is coupled to the charge pump circuit. The transistor Q9 is configured as the current source IUp for the charge pump circuit.

In operation, when either of the control signals UP or DOWN are at a logical high voltage level, the voltage level at the node VX will drop down towards ground causing the voltage level at the base of the transistor Q3 to drop down towards ground, thereby turning the transistor Q3 off. When the transistor Q3 is turned off, the capacitor Ce is charged up through the resistor Re. When the voltage level at the node Ve reaches a threshold voltage level Vth equal to a diode voltage drop across each of the diodes D1 and D2 plus a turn on voltage level for the transistor Q4, the transistor Q4 will turn on. This relationship is illustrated by the following equation:

$$Vth = VD1 + VD2 + V_{BEOnQ4}$$

When the transistor Q4 is turned on, the transistors Q5, Q6 and Q7 are all turned off. When the transistor Q7 is turned off the current source IDown is disabled. The transistors Q8 and Q9 are coupled together in a current mirror configuration so that the current flowing through the collector of the transistor Q9 will be mirrored by the current flowing through the collector of the transistor Q8. Therefore, when the transistor Q6 is turned off, there is no path for current to flow from the collector of the transistor Q8, thereby disabling the current source IUp flowing through the collector of the transistor Q9. In this manner, when the transistor Q3 is turned off for a long enough period of time because one of the control signals UP or DOWN remains at a logical high voltage level, the current sources IUp and IDown are disabled thereby maintaining an appropriate voltage level across the capacitor CH.

When the active control signal UP or DOWN is then turned off and pulled to a logical low voltage level, the voltage at the node VX will rise to a level sufficient to then turn on the transistor Q3. When the transistor Q3 is turned on, any charge built up on the capacitor Ce will be discharged through the transistor Q3. Therefore, if the active control signal UP or DOWN is turned off before the voltage level at the node Ve reaches the threshold voltage level Vth, the current sources IUp and IDown will not be disabled. If the current sources IUp and IDown have been disabled because the voltage level at the node Ve reached the threshold voltage level Vth, then when the active control signal UP or DOWN is turned off, the transistor Q3 is turned on and the capacitor Ce is discharged. When the capacitor Ce is discharged, the transistor Q4 is turned off and the transistors Q5, Q6 and Q7 are then turned on, thereby re-enabling the current sources IUp and IDown.

The time td required for the error regulator capacitor Ce to be charged to the threshold voltage level Vth is proportional to the value of the resistor Re multiplied by the value of the capacitor Ce, as illustrated by the following equation:

$$td \propto Re \times Ce$$

The time td required before the current sources IUp and IDown are disabled is therefore equal to the RC time constant for the circuit and may be set to a predetermined period of time by carefully selecting the values of the components Re and Ce. In the preferred embodiment of the present invention, the components Re and Ce have been chosen so that the time td is equal to 300 nanoseconds (ns).

A timing diagram of selected signals from a phase-locked loop having an error regulation circuit according to the present invention is illustrated in FIG. 4. A composite video reference signal VR is illustrated in FIG. 4a. An internal composite video signal VI is illustrated in FIG. 4b. Both of the composite video signals VR and VI include a burst period during which the signal is sampled and a non-burst or hold period. The control signals UP and DOWN are illustrated in FIGS. 4c and 4d, respectively. The voltage level VCH across the capacitor CH is illustrated in FIG. 4e. As described above, the control signals UP and DOWN are active during the burst or sampling period and then maintained at a constant level during the non-burst or inactive period.

Figure 1:
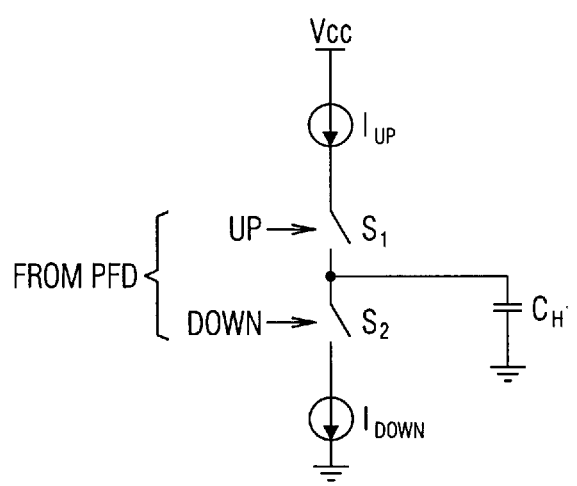
FIG. 1 illustrates a circuit schematic diagram of a charge pump circuit of the prior art.
Figure 2:
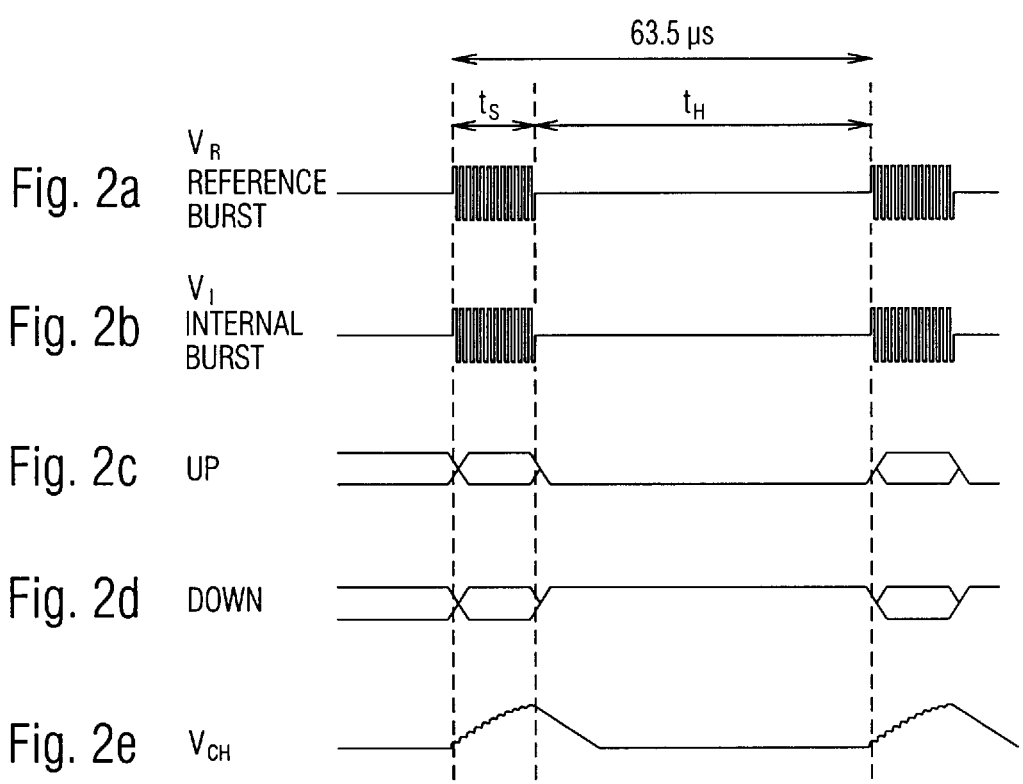
FIGS. 2a–2e illustrate a timing diagram of selected signals within a charge pump circuit of the prior art.

Each of the timing diagrams illustrated in FIG. 4 are identical to the timing diagrams illustrated in FIG. 2 with the exception of the timing diagram of FIG. 4e illustrating the voltage VCH across the capacitor CH. As illustrated in FIG. 4e, during a hold period when the control signal DOWN is at a logical high voltage level, the voltage VCH across the capacitor CH will drop by a small amount during the time period td. Correspondingly, when the control signal UP is at a logical high voltage level for a long period of time, the voltage VCH across the capacitor CH will rise by a small amount during the time period td. However, after the time period td when the threshold voltage level Vth has been reached and the current sources IUp and IDown are disabled, the voltage VCH across the capacitor CH is maintained at a constant level. During the next sampling period, the voltage VCH across the capacitor CH is either charged up or discharged until it reaches the appropriate level to lock the phases of the two video signals.

As stated above, the time td required for the voltage at the node Ve to reach the threshold voltage level Vth in the error regulator circuit of the preferred embodiment of the present invention is equal to 300 ns. A time period from the beginning of a burst signal to the beginning of the next burst signal of a standard composite video signal is equal to 63.5 microseconds (μs). The time td in the preferred embodiment has been chosen to be 300 ns which is approximately 0.5% of the total period for a standard composite video signal.

The preferred embodiment of the present invention is implemented within a video/graphics overlay integrated circuit, Part No. CXA2015Q, which will be available from Sony Corporation of America, 3300 Zanker Road, San Jose, Calif. 95134.

While the preferred embodiment of the present invention has been illustrated and described as an integrated circuit using bipolar transistors, it will be apparent to a person of ordinary skill in the art that the circuit of the present invention may be implemented using another device technology, including but not limited to CMOS, MOS, discrete components and ECL. It will also be apparent to those skilled in the art that different logic circuit configurations could be substituted for the logic circuit described above to perform the functions of the preferred embodiment.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

We claim:

1. An error regulator circuit for maintaining an appropriate level of charge across a storage element within a charge pump circuit, wherein the error regulator circuit is configured for disabling a charging and discharging circuit used to charge and discharge the storage element in response to one or more charge pump control signals, the error regulator circuit comprising:

a. a monitoring circuit coupled to receive one or more charge pump control signals for monitoring the one or more charge pump control signals and determining if any of the one or more charge pump control signals are maintained at a first voltage level for more than a predetermined period of time, wherein the charge pump control signals control charging and discharging of the storage element within the charge pump circuit; and b. a disabling circuit coupled to the monitoring circuit and configured for disabling the charge and discharge circuit when the monitoring circuit detects that any of the one or more charge pump control signals are maintained at the first voltage level for more than the predetermined period of time.

2. The error regulator circuit as claimed in claim 1 further comprising a re-enabling circuit coupled to the monitoring circuit and configured for reenabling the charge and discharge circuit after the charge pump control signal which was at the first voltage level for more than the predetermined period of time is no longer at the first voltage level.

3. The error regulator circuit as claimed in claim 2 wherein the error regulator circuit is configured for coupling to a charge pump circuit.

4. The error regulator circuit as claimed in claim 2 wherein the storage element is a capacitor.

5. The error regulator circuit as claimed in claim 4 wherein the one or more charge pump control signals include a first control signal and a second control signal used to control the charge pump circuit and store an amount of charge across the capacitor.

6. The error regulator circuit as claimed in claim 5 wherein the charge and discharge circuit further includes a charge supply circuit which operates in response to the first control signal for storing charge across the capacitor and a discharge circuit which operates in response to the second control signal for discharging charge stored across the capacitor and further wherein the disabling circuit disables both the charge supply circuit and the discharge circuit when the monitoring circuit detects that one of the first and second control signals have been at the first voltage level for more than the predetermined period of time.

7. The error regulator circuit as claimed in claim 6 wherein the charge supply circuit comprises a first current source and the discharge circuit comprises a second current source.

8. A method of maintaining an appropriate level of charge across a storage element within a charge pump circuit, wherein the storage element is charged through a charge supply circuit controlled by a first control signal and is discharged through a discharge circuit controlled by a second control signal, comprising the steps of:

a. monitoring the first and second control signals;
   b. determining if one of the first and second control signals have been maintained at a first voltage level for more than a predetermined period of time; and
   c. disabling the charge supply circuit and the discharge circuit when it is determined that one of the first and second control signals have been maintained at the first voltage level for more than the predetermined period of time.

9. The method as claimed in claim 8 further comprising the steps of:

a. determining when the one of the first and second control signals which was at the first voltage level for more than the predetermined period of time is no longer at the first voltage level; and
   b. re-enabling the charge supply circuit and the discharge circuit when it is determined that the one of the first and second control signals which was at the first voltage level for more than the predetermined period of time is no longer at the first voltage level.

10. The method as claimed in claim 9 wherein the storage element is a capacitor and the capacitor, charge supply circuit and discharge circuit are all part of the charge pump circuit.

11. A charge pump circuit for charging a storage element to an appropriate level in response to first and second control signals, comprising:

a. a storage element for storing an amount of charge;
   b. a charge supply circuit coupled to receive a first control signal and to the storage element for storing charge in the storage element when the first control signal is at a first voltage level;
   c. a discharge circuit coupled to receive a second control signal and to the storage element for discharging charge stored in the storage element when the second control signal is at a second voltage level;
   d. a monitoring circuit coupled to receive the first and second control signals for monitoring the first and second control signals and determining if one of the first and second control signals is maintained at the first and second voltage levels, respectively, for more than a predetermined period of time; and
   e. a disabling circuit coupled to the monitoring circuit, to the charge supply circuit and to the discharge circuit for disabling the charge supply circuit and the discharge circuit when the monitoring circuit detects that one of the first and second control signals is at the first and second voltage levels, respectively, for more than the predetermined period of time.

12. The charge pump circuit as claimed in claim 11 wherein the disabling circuit re-enables the charge supply circuit and the discharge circuit when the one of the first and second control signals which was at the first and second voltage level, respectively, for more than the predetermined period of time is no longer at the voltage level.

13. The charge pump circuit as claimed in claim 12 wherein the storage element is a capacitor.

14. The charge pump circuit as claimed in claim 13 wherein the charge supply circuit comprises a first current source and the discharge circuit comprises a second current source.

* * * * *

UNITED STATES PATENT AND TRADEMARK OFFICE
CERTIFICATE OF CORRECTION

PATENT NO.    :   5,828,254

DATED         :   October 27, 1998

INVENTOR(S)   :   Mehrdad Nayebi, et al.

It is certified that error appears in the above-identified patent and that said Letters Patent is hereby correct as shown below:

On Page 1, under the Related U.S. Application Data, after "60/000373" and before "21", delete "Jan." and insert --Jun.--.

In column 1, line 8, delete "60/000,369" and insert --60/000,373--.

Signed and Sealed this

Second Day of February, 1999

Attest:

Attesting Officer

*Acting Commissioner of Patents and Trademarks*